US008536678B2

(12) United States Patent
Nowak et al.

(10) Patent No.: US 8,536,678 B2
(45) Date of Patent: Sep. 17, 2013

(54) THROUGH SUBSTRATE VIA WITH EMBEDDED DECOUPLING CAPACITOR

(71) Applicant: QUALCOMM Incorporated, San Diego, CA (US)

(72) Inventors: Matthew Michael Nowak, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/654,245

(22) Filed: Oct. 17, 2012

(65) Prior Publication Data
US 2013/0040436 A1 Feb. 14, 2013

Related U.S. Application Data

(62) Division of application No. 12/479,885, filed on Jun. 8, 2009, now Pat. No. 8,294,240.

(51) Int. Cl.
H01L 29/92 (2006.01)

(52) U.S. Cl.
USPC .......... 257/532; 257/534; 257/E29.343; 257/E29.346; 257/E21.008; 438/386; 438/667

(58) Field of Classification Search
USPC .......... 257/532, 534, E29.343, E29.346, 257/E21.008; 438/386, 396, 667
See application file for complete search history.

(56) References Cited

U.S. PATENT DOCUMENTS

| 5,122,924 | A | 6/1992 | Okumura |
| 5,682,062 | A | 10/1997 | Gaul |
| 5,814,889 | A | 9/1998 | Gaul |
| 6,002,177 | A | 12/1999 | Gaynes et al. |
| 6,437,385 | B1 | 8/2002 | Bertin et al. |
| 6,897,552 | B2 | 5/2005 | Nakao |
| 6,963,483 | B2 | 11/2005 | Chakravorty et al. |
| 7,157,372 | B1 | 1/2007 | Trezza |
| 7,866,038 | B2 * | 1/2011 | Yakabe et al. ............. 29/852 |
| 8,294,240 | B2 | 10/2012 | Nowak et al. |
| 8,362,589 | B2 * | 1/2013 | Quinn ..................... 257/532 |
| 2002/0036338 | A1 | 3/2002 | Matsuo et al. |
| 2004/0084751 | A1 | 5/2004 | Stern |

(Continued)

FOREIGN PATENT DOCUMENTS
JP 1179443 A 7/1989

OTHER PUBLICATIONS

International Search Report and Written Opinion—PCT/US2010/037798, International Search Authority—European Patent Office—Aug. 20, 2010.
Taiwan Search Report—TW099118599—TIPO—Jan 2, 2013.

Primary Examiner — Allan R Wilson
(74) Attorney, Agent, or Firm — Sam Talpalatsky; Nicholas J. Pauley; Joseph Agusta

(57) ABSTRACT

A method of manufacturing a semiconductor die having a substrate with a front side and a back side includes fabricating openings for through substrate vias on the front side of the semiconductor die. The method also includes depositing a first conductor in the through substrate vias, depositing a dielectric on the first conductor and depositing a second conductor on the dielectric. The method further includes depositing a protective insulator layer on the back side of the substrate covering the through substrate vias.

18 Claims, 21 Drawing Sheets

(56) References Cited

U.S. PATENT DOCUMENTS

| | | |
|---|---|---|
| 2005/0106845 A1 | 5/2005 | Halahan et al. |
| 2006/0001174 A1 | 1/2006 | Matsui |
| 2008/0113505 A1 | 5/2008 | Sparks et al. |
| 2008/0299768 A1* | 12/2008 | Yamano ........................ 438/667 |
| 2009/0267183 A1 | 10/2009 | Temple et al. |
| 2010/0110607 A1 | 5/2010 | Denatale et al. |
| 2010/0164062 A1* | 7/2010 | Wang et al. ................... 257/532 |
| 2010/0171209 A1 | 7/2010 | Tanie et al. |

* cited by examiner

THROUGH SUBSTRATE VIA WITH EMBEDDED DECOUPLING CAPACITOR

CROSS REFERENCE TO RELATED APPLICATION

This application is a divisional of co-pending U.S. patent application Ser. No. 12/479,885 filed Jun. 8, 2009, entitled "THROUGH SILICON VIA WITH EMBEDDED DECOUPLING CAPACITOR."

TECHNICAL FIELD

The present disclosure generally relates to integrated circuits (ICs). More specifically, the present disclosure relates to decoupling circuitry for ICs.

BACKGROUND

ICs are generally fabricated on one side of a semiconductor die. These dies are then used to power a diverse range of electronics products. IC packages conventionally include only one layer of ICs. Building multiple layers of ICs (or "stacking" the ICs) in the same semiconductor package can significantly reduce the lateral size of electronics and reduce the cost of manufacturing. As a result, stacked ICs are quickly gaining popularity for further extending the capabilities of electronics.

One feature used in building stacked ICs are through substrate vias (TSV). Through substrate vias are connections through the substrate of the die and may be used to connect a layer of ICs on one side of the substrate to an opposite side of the substrate where contacts may be provided for packaging the substrate. Through substrate vias occupy relatively small amounts of substrate area and do not otherwise interfere with circuitry built on the substrate thereby increasing the possible density of ICs. As the transistor density increases, the voltage supplied to the transistors decreases. These voltages are commonly smaller than the wall voltages available in most countries.

ICs are coupled to a voltage regulator that converts available wall voltages to the lower voltages used by the ICs. The voltage regulator ensures a predictable power supply is provided to the ICs. This is an important function because the tolerance of transistors to voltages under or over the target voltage is small. Only tenths of a volt lower may create erratic results in the ICs; only tenths of a volt higher may damage the ICs. As transistors in the ICs turn on and off, the power load changes rapidly placing additional demand on the voltage regulator. The distance between the voltage regulator and the ICs creates a long response time, preventing the voltage regulator from increasing power to the ICs instantaneously, especially when the transistors switch on and off millions or billions of times each second. Decoupling capacitors provide additional stability to the power supplied to ICs.

Decoupling capacitors attached in close proximity to ICs provide a local charge reservoir for the ICs. As demand on the power supply changes rapidly, the capacitor provides additional power and can refill at a later time when the power demand decreases. The decoupling capacitor allows ICs to operate at the high frequencies and computational speeds desired by consumers. However, as the transistor sizes have decreased and transistor densities increased, finding area on the ICs for decoupling capacitors has become difficult. Conventionally, capacitors are built from thick oxide transistors commonly used for I/O transistors. These capacitors are fabricated on the substrate to provide decoupling capacitance for the circuitry on the substrate. Thick oxide transistors offer very small values of capacitance in comparison to the large amounts of substrate area they consume that could otherwise be used for other circuitry.

Alternatively, through substrate vias may provide capacitance for decoupling. Through substrate vias include a conducting core and an insulating sleeve contained in a semiconductor substrate. If the conductor is connected to a supply voltage and the substrate is connected to a ground, then a capacitor is formed between the conducting core and the substrate. The capacitance is determined by the thickness of the insulator layer, the height of the through substrate vias, and the dielectric constant of the insulator layer. Generally, the dielectric constant is not easily changed. Therefore, the capacitance may be increased by decreasing the thickness of the insulating layer or increasing the height of the through substrate vias.

Semiconductor substrates experience charge depletion that creates an additional capacitance combined with the capacitance of the through substrate vias to form an effective capacitance. This effective capacitance will always be smaller than the smallest of the capacitance of the through substrate vias and the capacitance of the substrate. As a result, without changing the material of the substrate, only minor increases in effective capacitance may be gained from changing the design of through substrate vias.

Another type of via commonly found in ICs is a substrate or printed circuit board via. A substrate via is used to electrically couple several conductive layers in a printed circuit board substrate or packaging substrate. The vias are holes etched through the substrate that are plated with conductors and used to carry signals between layers. Multiple conductors may be plated in the vias separated by insulators to carry multiple signal lines through the via. However, these vias have low capacitance, if any. The insulator layer in the vias are thick (for example, 15-60 μm). The thickness prevents their use as decoupling capacitors. Additionally, depositing thin insulators with current techniques, namely lamination or build-up, is challenging.

Therefore, a new technique for providing decoupling of the circuitry from the die is needed that provides a higher degree of decoupling.

BRIEF SUMMARY

A semiconductor die includes a through substrate via having a capacitor. The capacitor has a first co-axial conductor, a second co-axial conductor, and a co-axial dielectric separating the first co-axial conductor from the second co-axial conductor.

A stacked IC includes a first die and a second die. The second die is coupled to the first die. The second die has a through substrate via including a capacitor. The capacitor includes a first co-axial conductor, a second co-axial conductor outside of the first co-axial conductor, and a first co-axial dielectric partially separating the first co-axial conductor from the second co-axial conductor.

A method of manufacturing an IC, having a substrate with a front side and a back side, includes fabricating openings for through substrate vias on the front side of the substrate. The method also includes depositing a first conductor in the through substrate vias. The method further includes depositing a dielectric on the first conductor. The method additionally includes depositing a second conductor on the dielectric.

A method of manufacturing a stacked IC, having a substrate with a front side and a back side, includes fabricating an opening for a through substrate via on the back side of the substrate. The method also includes depositing a first conductor in the through substrate via. The method further includes depositing a dielectric on the first conductor. The method additionally includes depositing a second conductor on the dielectric. The first conductor and the second conductor are configured as terminals of a decoupling capacitor.

A stacked IC having at least one die with a subs rate includes the die having means for storing charge in close proximity to a component of the stacked IC. The means is located in an opening in the substrate The foregoing has outlined rather broadly the features and technical advantages of the present disclosure in order that the detailed description that follows may be better understood. Additional features and advantages will be described hereinafter that form the subject of the claims of the disclosure. It should be appreciated by those skilled in the aft that the conception and specific aspects disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features that are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

One method for providing decoupling of ICs from the die is to build the decoupling capacitors into the through substrate vias. Through substrate vias are already well integrated into the manufacturing process for stacked ICs, and large numbers exist on stacked ICs, Building decoupling capacitors into the through substrate vias has several advantages.

Removing conventional separate decoupling capacitors from the substrate increases the die area available for active circuitry. The reduction in die size leads to smaller portable electronic devices. Additionally, building the decoupling capacitor into a structure that is already present in the die reduces manufacturing costs. Fewer processes are used to embed the decoupling capacitor in through substrate vias than to build a separate decoupling capacitor.

Figure 1:
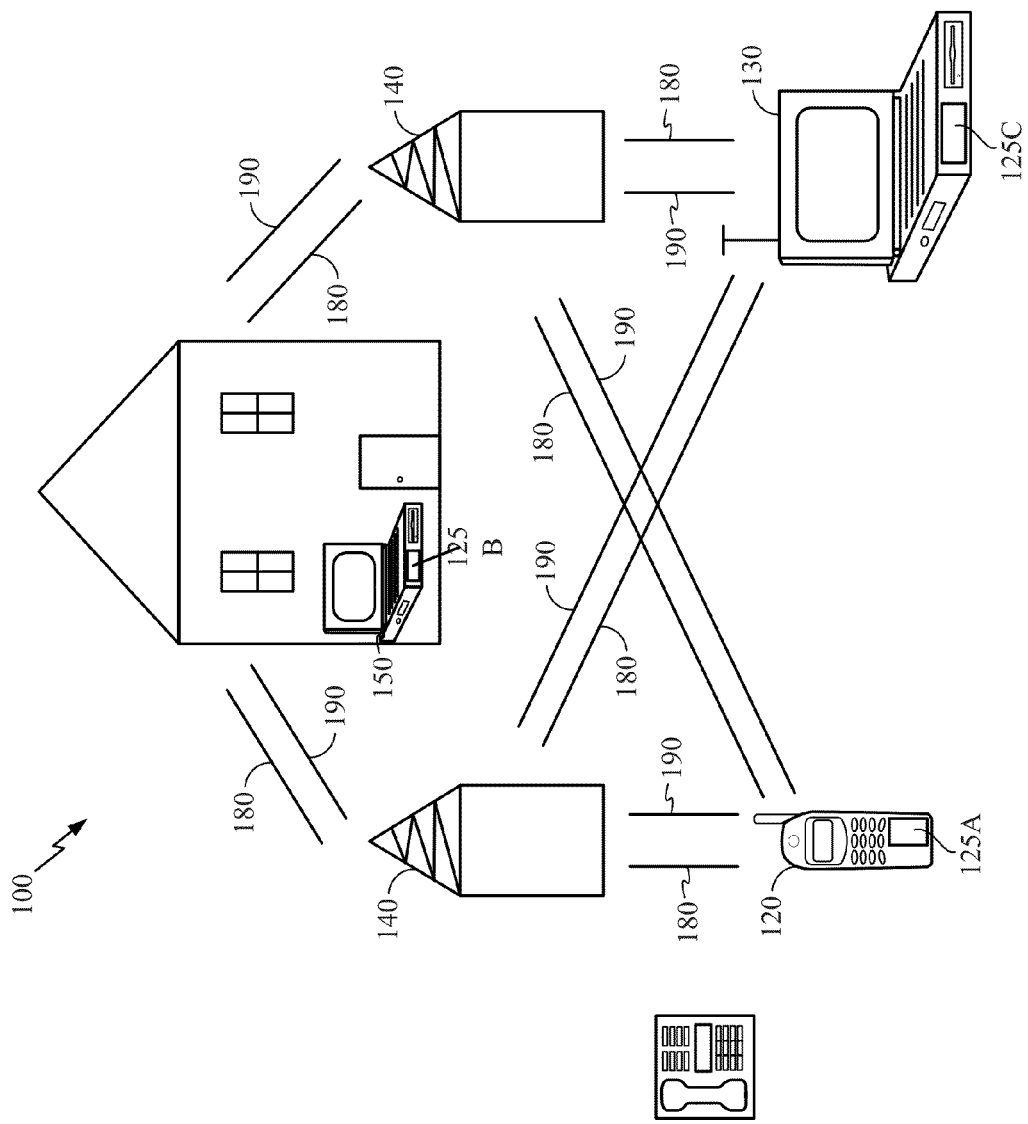
FIG. 1 is a block diagram showing an exemplary wireless communication system.

In FIG. 1, remote unit 120 is shown as a mobile telephone, remote unit 130 is shown as a portable computer, and remote unit 150 is shown as a fixed location remote unit in a wireless local loop system. For example, the remote units may be mobile phones, hand-held personal communication systems (PCS) units, portable data units such as persona data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. Aspects of the disclosure may be suitably employed in any device which includes active integrated circuitry including memory.

The foregoing disclosed devices and methods are typically designed and are configured into a hardware description language, such as GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Figure 2A:
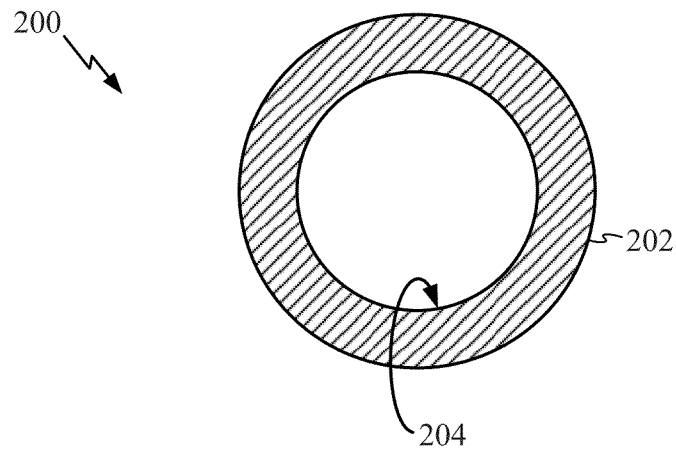
FIG. 2A is a drawing showing a top view of a conventional through substrate via.

Turning now to FIG. 2A, an illustration showing a conventional through substrate via is presented, A top view of a through substrate via 200 includes a conductor 204 surrounded by an insulator 202. The through substrate via 200 will now be presented in a perspective view and explained in further detail.

Figure 2B:
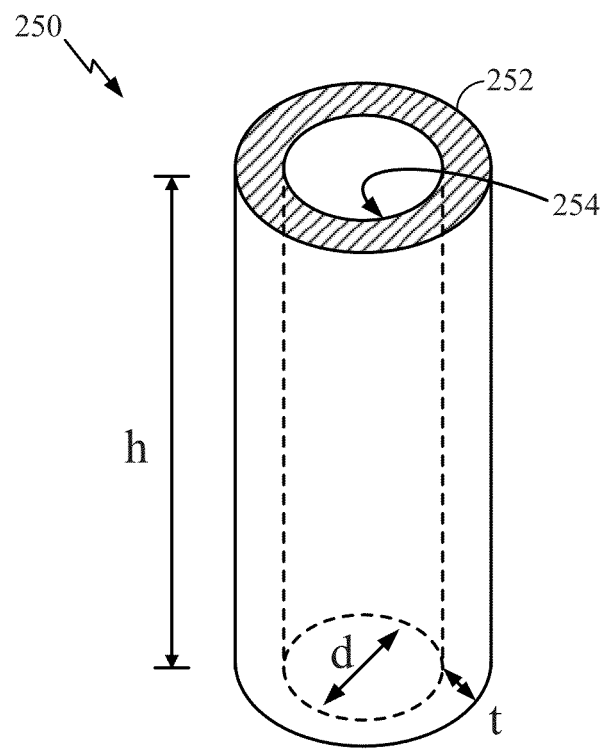
FIG. 2B is a drawing showing a perspective view of a conventional through substrate via.

FIG. 2B is an illustration showing a perspective view of a conventional through substrate via. A through substrate via 250 includes a conductor 254 that extends the length of the through substrate via 250. One possible use for the conductor 254 is to carry signals through the semiconductor substrate. The conductor 254 may be, for example, copper, aluminum, tungsten, or poly-silicon. The conductor 254 has a diameter, d. Surrounding the conductor 254 is an insulator 252. The insulator (also referred to as a dielectric) 252 extends the length of the through substrate via 250 to prevent shorting of the conductor 254 to a surrounding semiconductor die (not shown). The insulator 252 may be, for example, silicon dioxide or silicon nitride. The insulator 252 has a thickness, t. The total diameter of the through substrate via 250 is given by d+t.

Figure 3:
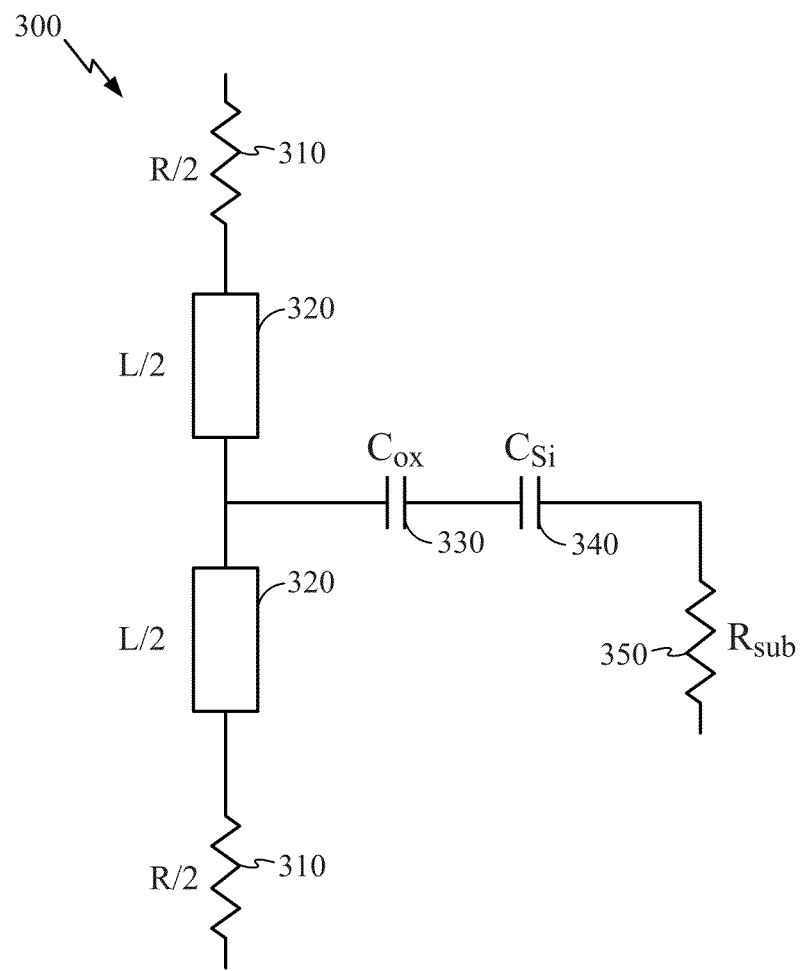
FIG. 3 is a circuit schematic illustrating an equivalent circuit for a through substrate via.

ICs built using the conventional through substrate via illustrated by FIG. 2B may be represented by an equivalent circuit for analysis. FIG. 3 is a circuit schematic illustrating an equivalent circuit for a conventional through substrate via. An equivalent circuit 300 includes capacitance of the insulator represented by a capacitor 330, with value $C_{ox}$, that is proportional to the thickness of the insulator 252. An additional capacitance arises as flow of charge carriers through the semiconductor substrate causes charge depletion. Depletion of charge in the semiconductor substrate is represented by a capacitor 340, with value $C_{Si}$. An effective capacitance representing all capacitances, $C_{eff}$, is a series combination of the capacitor 330 and the capacitor 340. Resistance along the conductor 254 is represented by a resistor 310, with value R. Inductance along the conductor 254 is represented by an inductor 320, with value L. Additionally, resistance of the semiconductor substrate is represented by a resistor 350 with value $R_{sub}$.

The effective capacitance, $C_{eff}$, of a series combination of the substrate capacitance, $C_{Si}$, and the insulator capacitance, $C_{ox}$, will always be smaller than the minimum of $C_{Si}$ and $C_{ox}$. The substrate capacitance, $C_{Si}$, is a fixed value based on the material used in the substrate. Changing the substrate material is not easily accomplished. Insulator capacitance, $C_{ox}$, can be changed through manufacturing design parameters, but has little impact on the effective capacitance, $C_{eff}$, because the substrate capacitance, $C_{Si}$, is commonly smaller than the insulator capacitance, $C_{ox}$. Therefore, it would be preferable to eliminate the substrate capacitance, $C_{Si}$, from the effective capacitance, $C_{eff}$. Additionally, the substrate resistance, $R_{sub}$, has a negative impact on the capacitance of the structure, and it would be preferable to eliminate $R_{sub}$ from the equivalent circuit. The aspect that will be described below eliminates the substrate capacitance, $C_{Si}$, and the substrate resistance, $R_{sub}$, through the use of an additional conducting layer.

Figure 4A:
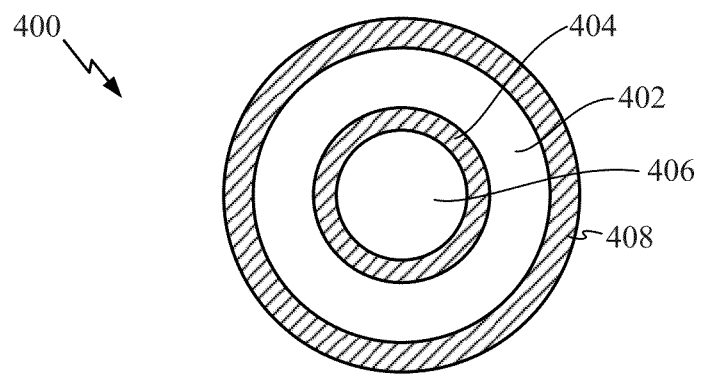
FIG. 4A is a drawing showing a top view of an exemplary through substrate via with decoupling capacitor according to one aspect.

Turning now to FIG. 4A, a decoupling capacitor embedded in a through substrate via will be discussed. FIG. 4A is an illustration showing an exemplary through substrate via with a decoupling capacitor according to one aspect. A top view of a through substrate via 400 includes a first conductor 406 surrounded by a first insulator 404. The through substrate via further includes a second conductor 402 surrounding the first insulator 404 and a second insulator 408 surrounding the second conductor 402. The through substrate via 400 will now be presented in a perspective view and explained in further detail.

Figure 4B:
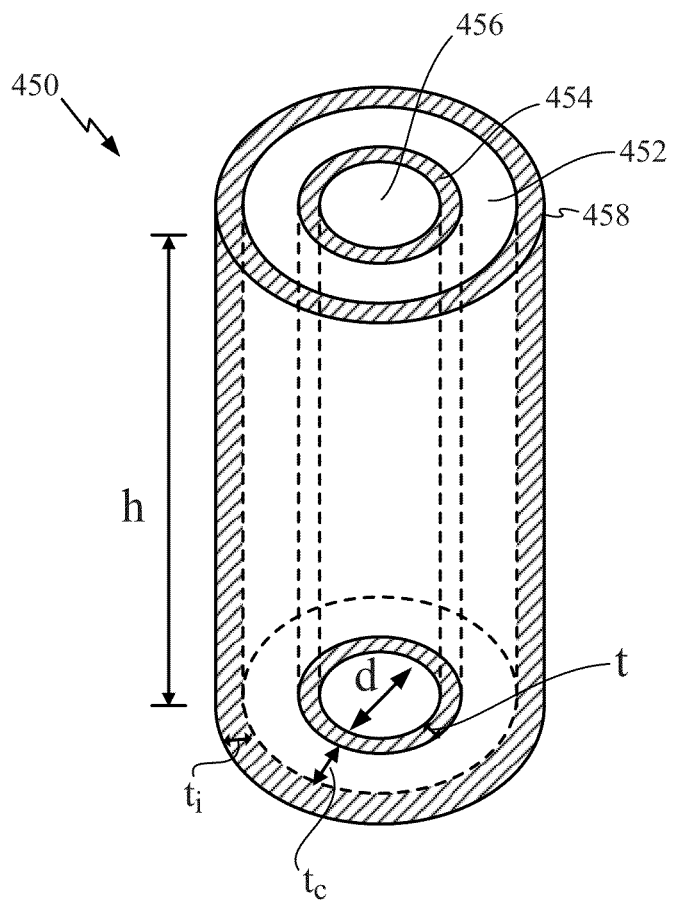
FIG. 4B is a drawing showing a perspective view of an exemplary through substrate via with decoupling capacitor according to one aspect.

FIG. 4B is a perspective view of an exemplary through substrate via according to one aspect. A through substrate via 450 includes a first conductor 456 that extends the length of the through substrate via 450. The first conductor 456 has a diameter, d. A second conductor 452 is shown as the outer annulus and stretches the length of the through substrate via 450. The second conductor 452 has a thickness, $t_c$. According to one aspect, the second conductor 452 and the first conductor 456 carry signals through a semiconductor substrate (not shown). The second conductor 452 may be copper or a refractory metal. The first conductor 456 may be, for example, copper, aluminum, tungsten, or poly-silicon. Surrounding the first conductor 456 is a first insulator 454 to prevent shorting of the first conductor 456 to the second conductor 452. The first insulator 454 has a thickness, t. Surrounding the second conductor 452 is a second insulator 458. The second insulator 458 has a thickness, $t_i$, and is useful to prevent shorting of the second conductor 452 with a surrounding semiconductor die (not shown). The first insulator 454 and the second insulator 458 may be, for example, silicon oxide or silicon nitride. In one aspect, the first insulator 454 has a high dielectric constant, such as that of silicon nitride. The first conductor 456, the first insulator 454, and the second conductor 452 form a capacitor, that according to one aspect, decouples circuitry from a semiconductor die (not shown).

The capacitor embedded in the through substrate via 450 includes the conductors 452,456. As a result, current flow in the through substrate via 450 no longer results in electron flow through the semiconductor substrate. Addition of the second conductor 452 reduces or eliminates the substrate capacitance, $C_{Si}$. As a result, the effective capacitance, $C_{eff}$, of the structure equals the value of the oxide capacitance, $C_{ox}$. Further, the substrate resistance, $R_{sub}$, is reduced or eliminated because the electrons no longer flow through the substrate.

A sample calculation for the conventional and exemplary through substrate via will now be compared. For example, if a through substrate via is constructed with a diameter of 6 μm and a height of 50 μm, then the capacitance, $C_{ox}$, of the oxide (with a thickness of 200 nm) is approximately 190 femtoFarads. The capacitance of the substrate, $C_{Si}$, is approximately 140 femtoFarads resulting in an effective capacitance, $C_{eff}$, of approximately 80 femtoFarads. The area, A, occupied by the through substrate via of these dimensions is approximately 30 μm². Therefore the capacitance per area, $C_{eff}/A$, is approximately 3000 nF/μm² in a conventional through substrate via. However, adding the second conductor 452 removes $C_{Si}$ from the effective capacitance, resulting in a capacitance per area of $C_{ox}/A$ that is approximately double $C_{eff}/A$, or 6000 nF/μm². Conventional thick oxide transistor decoupling capacitors commonly have a capacitance per area of 10 nF/μm². Therefore, the capacitance per area increase resulting from embedding a decoupling capacitor in a through substrate via is larger than other decoupling solutions available.

Figure 5:
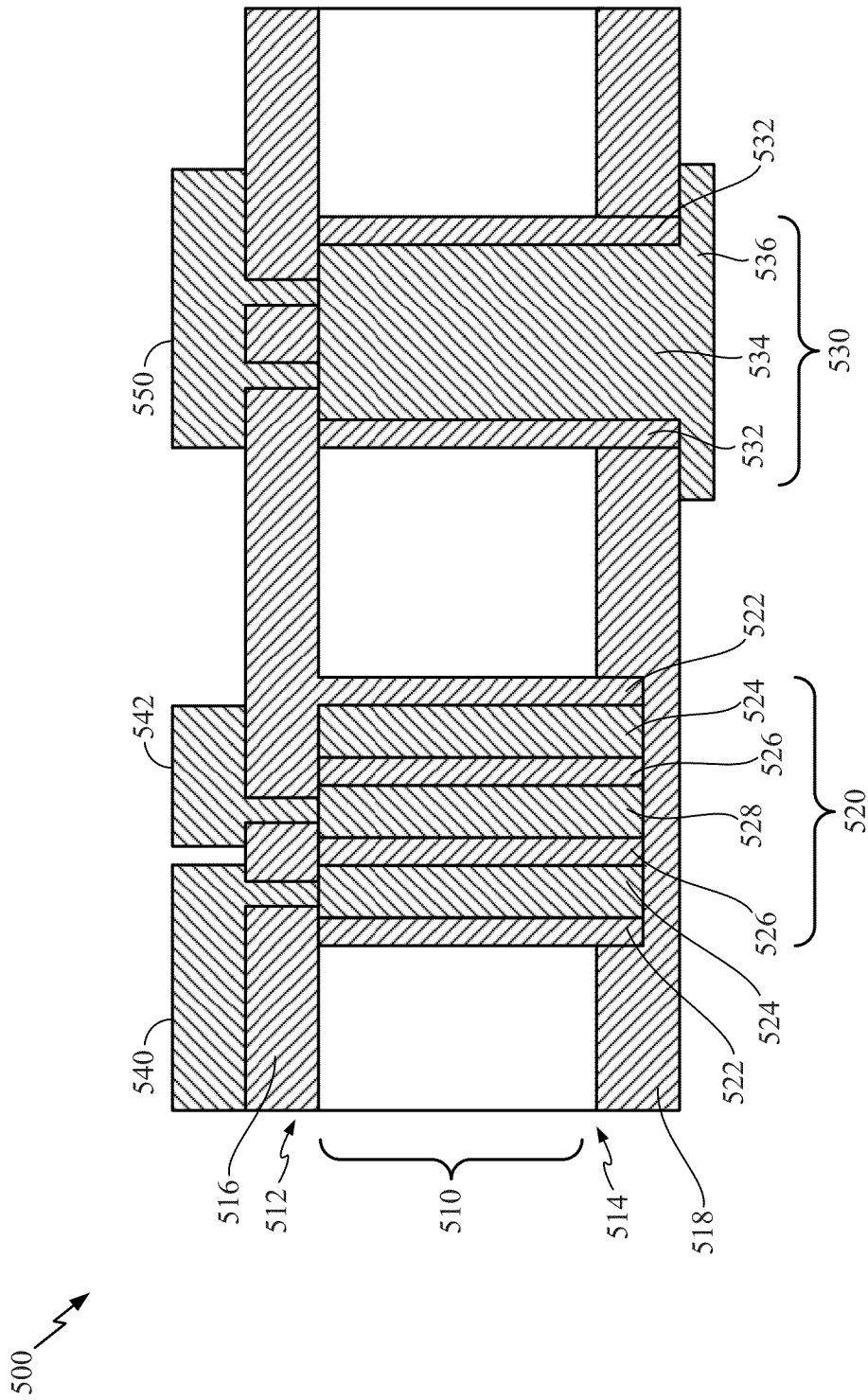
FIG. 5 is a cross section showing an exemplary die configuration according to one aspect.

Turning now to FIG. 5, the exemplary through substrate via of FIG. 4 is shown integrated into a semiconductor die. FIG. 5 is across section showing an exemplary die configuration according to one aspect. A fabricated die 500 shown in its cross section includes a substrate 510. The substrate 510 has a front side 512 and a back side 514. The front side 512 may contain active circuitry and can be coated by a protective layer 516 that may be, for example, silicon nitride or silicon oxide. Similarly, the back side 514 is coated by a protective layer 518. Contained within the substrate 510 are a through substrate via with an embedded decoupling capacitor 520 and a through substrate via without an embedded decoupling capacitor 530 manufactured using a single fabrication process. Although only two through substrate vias are shown here, a fabricated die may include many more through substrate vias. Additionally, although only one substrate is shown here, a stacked IC may contain many more substrates.

The through substrate via 530 includes a first conductor 534 and a first insulator 532. The first conductor 534 couples to a contact pad 536 on the back side 514. The first conductor 534 also couples to a contact pad 550 on the front side 512. The through substrate via 530 is manufactured during the same process as the through substrate via 520, according to one aspect. The through substrate via 530 is useful to convey signals from the contact pad 550 to the contact pad 536. According to one aspect, it may be used similarly to a conventional through substrate via.

The through substrate via 520 includes an embedded decoupling capacitor as shown in FIG. 4. A first conductor 528 extends the length of the through substrate via 520. Surrounding the first conductor 528 is a first insulator 526. Surrounding the first insulator 526 is a second conductor 524 separated from the first conductor 528. Surrounding the second conductor 524 is a second insulator 522 that separates the second conductor 524 from the substrate 510. Coupled to the second conductor 524 is a contact pad 540. Similarly, coupled to the first conductor 528 is a contact pad 542. A capacitor is formed with the first conductor 528 and the second conductor 524; the contact pad 540 and the contact pad 542 act as connections to two terminals of a capacitor.

Figure 6:
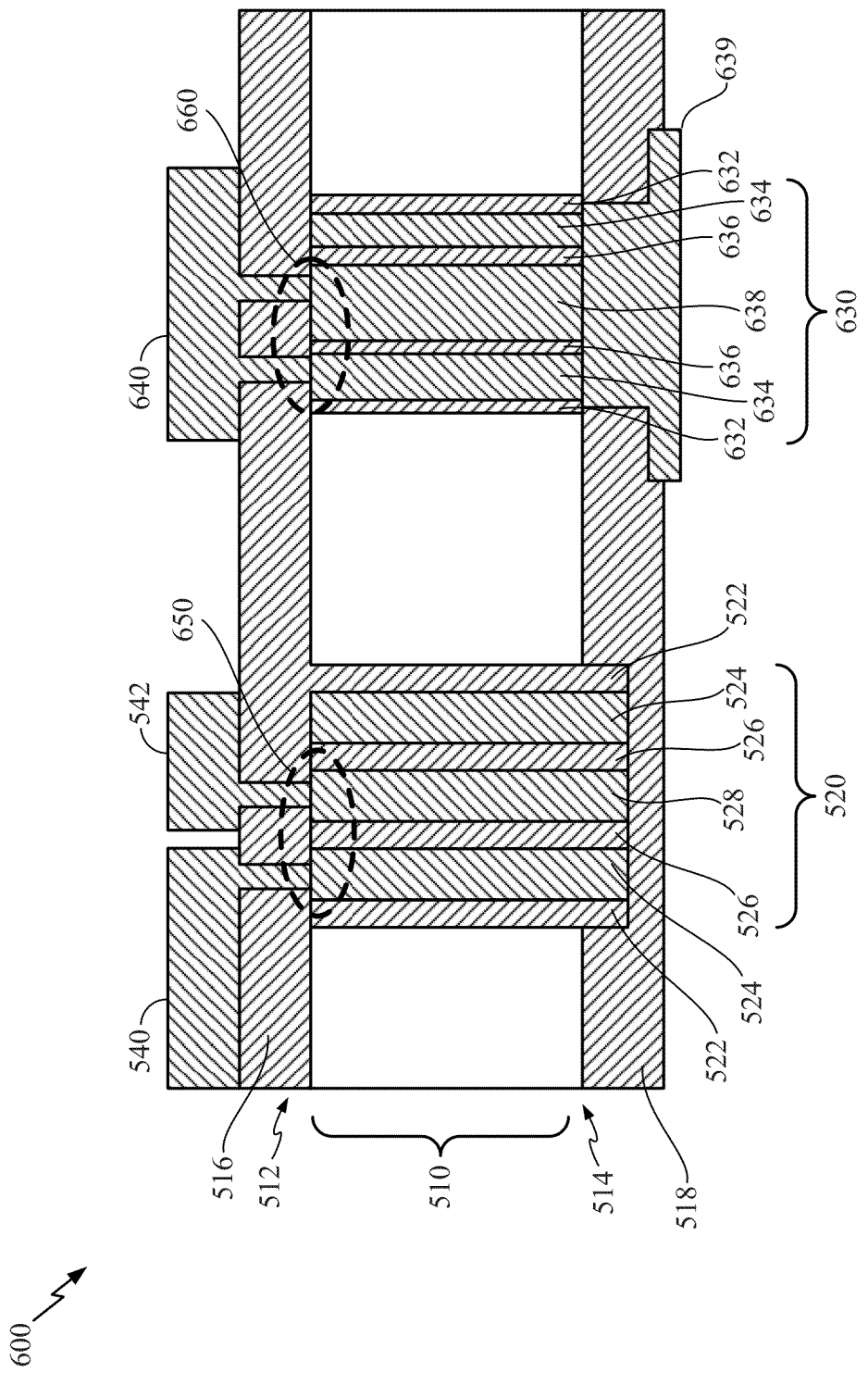
FIG. 6 is a cross section showing an alternative exemplary die configuration according to one aspect.

One alternative to the die configuration of FIG. 5 includes constructing all through substrate vias to include multiple conductors. FIG. 6 is a cross section showing an alternative exemplary die configuration according to one aspect. A fabricated die 600 includes the substrate 510 configured similarly to that of FIG. 5. Additionally, the fabricated die 600 includes a through substrate via 630. The through substrate via 630 includes an exemplary decoupling capacitor as illustrated in FIG. 4. The through substrate via 630 includes a first conductor 638 and a second conductor 634 separated by a first insulator 636. The second conductor 634 is separated from the substrate 510 by a second insulator 632. A contact pad 639 couples to the second conductor 634 and the first conductor 638 on the back side 514. Additionally, a contact pad 640 couples to the second conductor 634 and the first conductor 638 on the front side 512. In this configuration, the second conductor 634 and the first conductor 638 are short-circuited. At a region 660 the contact pad 640 is coupled to the first conductor 638 and the second conductor 634. At a region 650 the contact pad 540 is coupled to the second conductor 524 and the contact pad 542 is coupled to the first conductor 528. The through substrate via 630 may be used, for example, to convey signals from the front side 512 to the back side 514.

Although the through substrate via 630 in FIG. 6 serves the same purpose as the through substrate via 530 in FIG. 5, manufacturing of the fabricated die 600 involves fewer processes than the fabricated die 500. However, the through substrate via 630 has lower conductance than the through substrate via 530 as a result of the first insulator 636.

At least two processes may be used to manufacture through substrate vias. The first, known as via first, involves creating the via in the substrate during wafer fabrication before or after front end of line device fabrication. The second, known as via last, involves creating the via in the substrate after fabricating active circuitry on the substrate. Each process has its own advantages and disadvantages. One method of fabricating the embedded decoupling capacitor will be illustrated for the via first process, and one method will be illustrated for the via last process.

Figure 7:
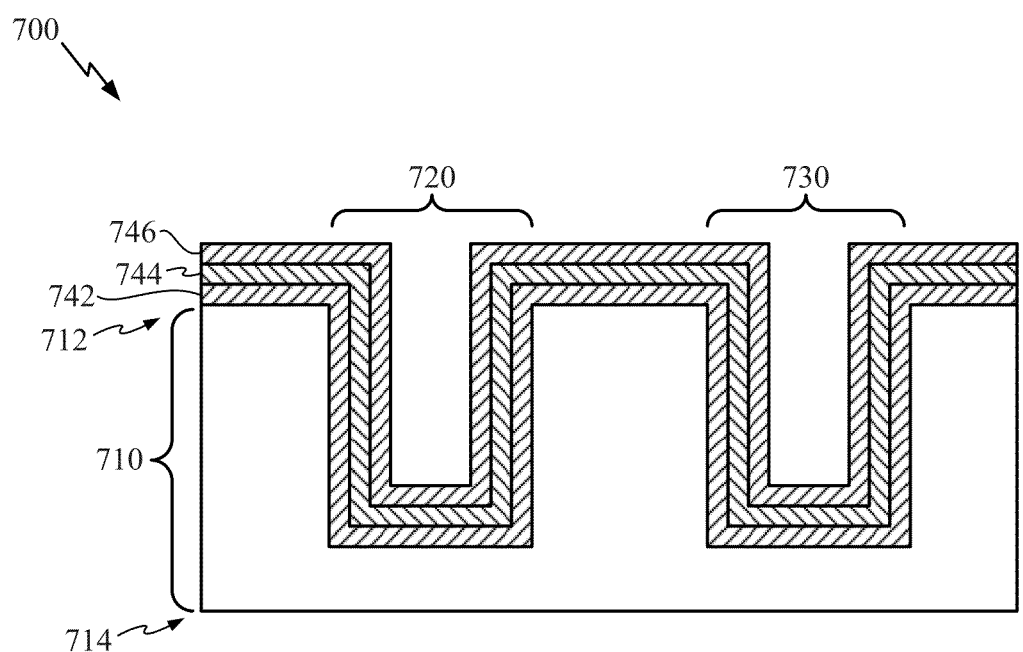
FIG. 7 is a cross section showing an exemplary die configuration after a first manufacturing process in a via first processing technique according to one aspect.

Turning now to FIG. 7, an exemplary via first process for manufacturing through substrate vias with embedded decoupling capacitors will be demonstrated. FIG. 7 is a cross section showing an exemplary die configuration after a first manufacturing process in a via first processing technique according to one aspect. A die 700 includes a substrate 710 having a front side 712 and a back side 714 A through substrate via 720 and a through substrate via 730 are formed by etching the front side 712. Etching may include, for example, wet etching or dry etching. Afterwards, three conformal layers are deposited on the front side 712. A first insulator 742 is deposited, followed by a first conductor 744, and a second insulator 746.

Figure 8:
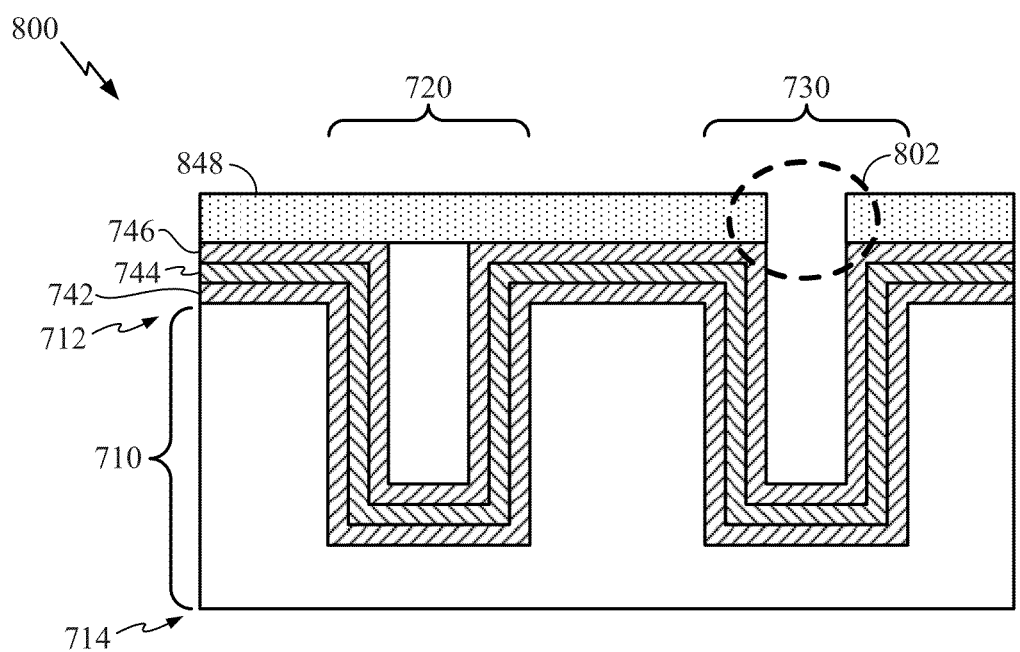
FIG. 8 is a cross section showing an exemplary die configuration after a second manufacturing process in a via, first processing technique according to one aspect.

Turning now to FIG. 8, additional processes are performed in the fabrication of the through substrate vias. FIG. 8 is a cross section showing an exemplary die configuration after a second manufacturing process in a via first processing technique according to one aspect. A die 800 includes a sacrificial layer 848 deposited on the front side 712. A section of the sacrificial layer 848 above the through substrate via 730 at a region 802 is removed. The sacrificial layer 848 may be, for example, a photoresist material. The region 802 may be cleared of the photoresist by exposure to an appropriate light source and development.

Figure 9:
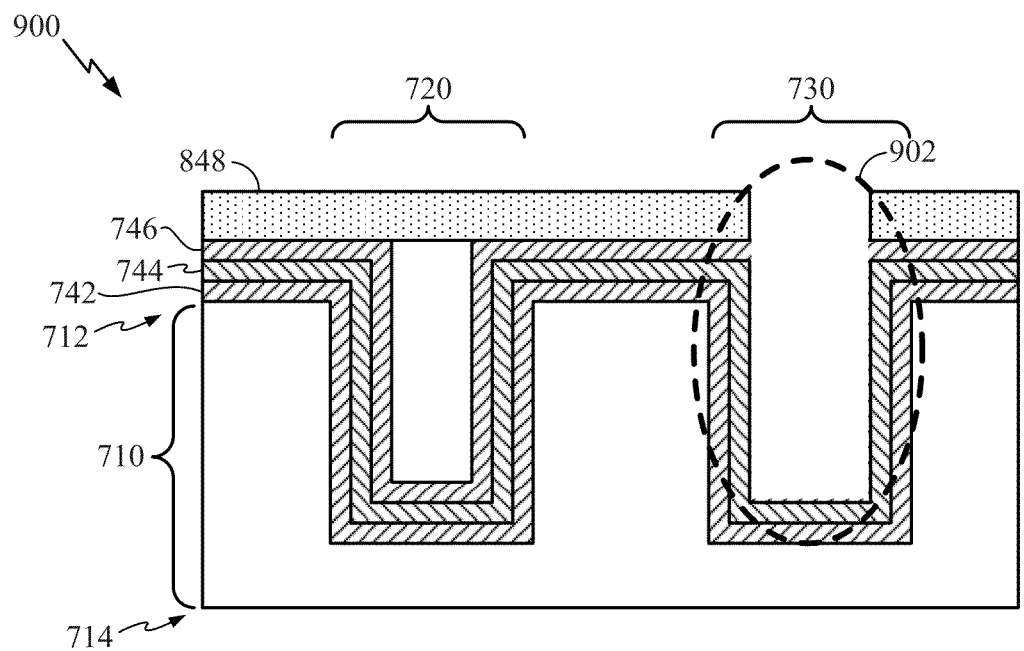
FIG. 9 is a cross section showing an exemplary die configuration after a third manufacturing process in a via first processing according to one aspect.

Turning now to FIG. 9, additional processes are performed in the fabrication of the through substrate vias. FIG. 9 is a cross section showing an exemplary die configuration after a third manufacturing process in a via first processing technique according to one aspect. A die 900 has etching performed through the opening over the through substrate via 730 to remove a section of the second insulator 746. A region 902 demonstrates the through substrate via 730 after etching of the second insulator 746.

Figure 10:
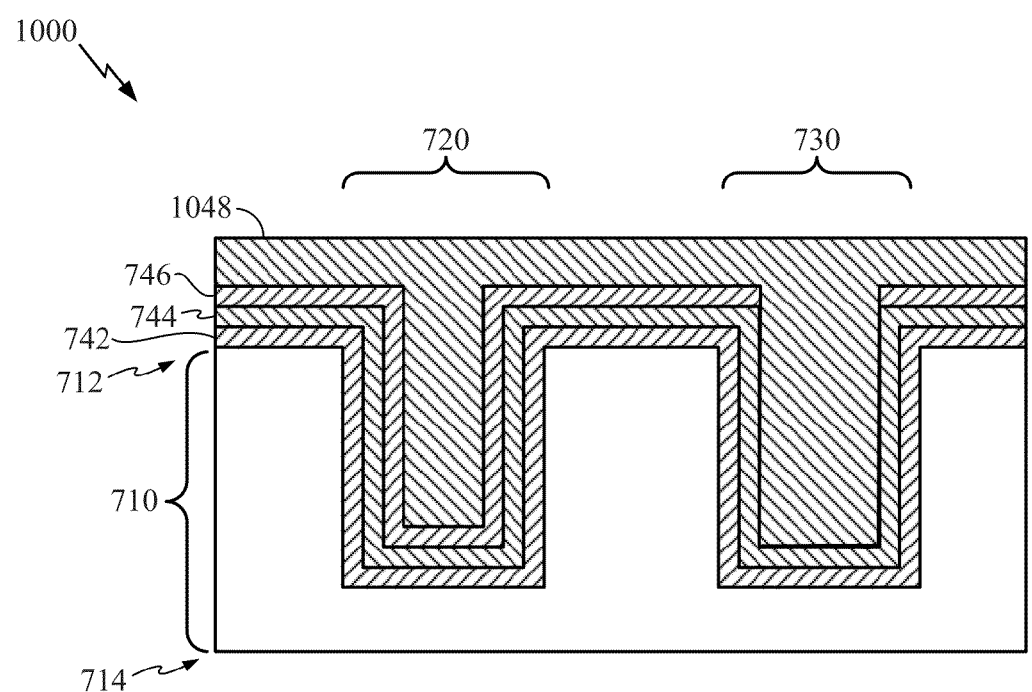
FIG. 10 is a cross section showing an exemplary die configuration after a fourth manufacturing process in a via first processing technique according to one aspect.

Turning now to FIG. 10, additional processes are performed in the fabrication of the through substrate vias. FIG. 10 is a cross section showing an exemplary die configuration after a fourth manufacturing process in a via first processing technique according to one aspect. A die 1000 has the sacrificial layer 848 removed. A second conductor 1048 has been deposited on the front side 712 and fills the through substrate via 720 and the through substrate via 730.

Figure 11:
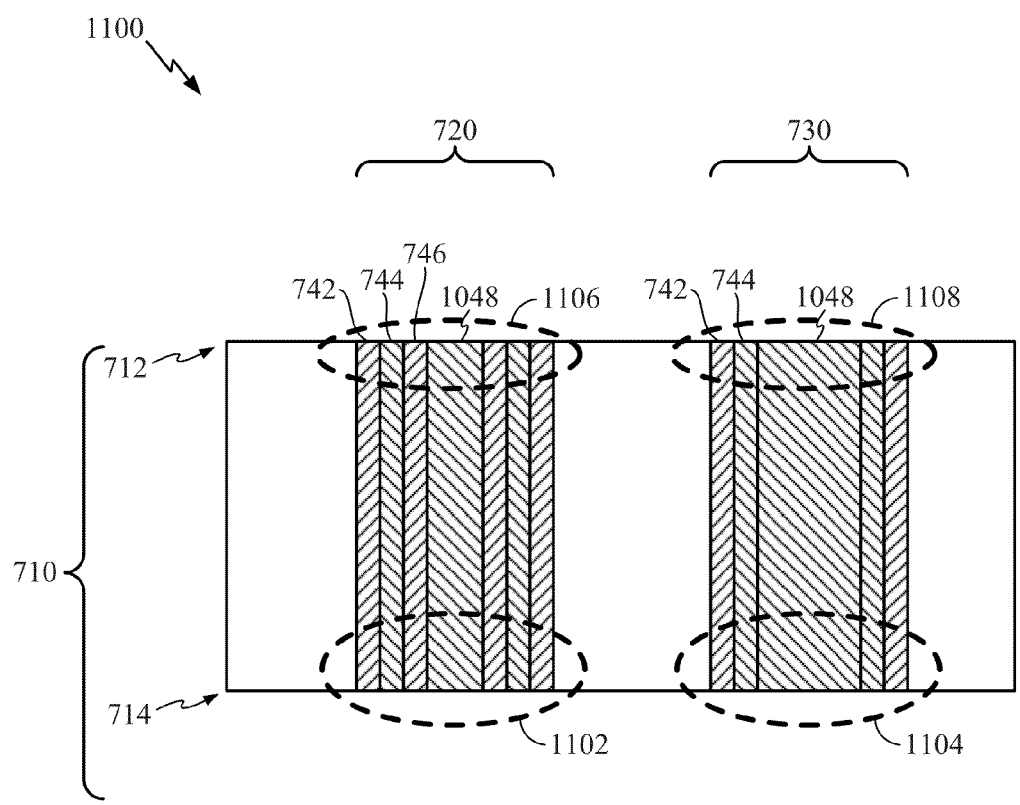
FIG. 11 is a cross section showing an exemplary die configuration after a fifth manufacturing process in a via first processing technique according to one aspect.

Turning now to FIG. 11, additional processes are performed the fabrication of the through substrate vias. FIG. 11 is a cross section showing an exemplary die configuration after a fifth manufacturing process in a via first processing technique according to one aspect. A die 1100 has been polished on the front side 712 to expose contact points at a region 1106 for the through substrate via 720 and at a region 1108 for the through substrate via 730. Additionally, the back side 714 has been polished to expose contact points at a region 1102 for the through substrate via 720 and at a region 1104 for the through substrate via 730.

Figure 12:
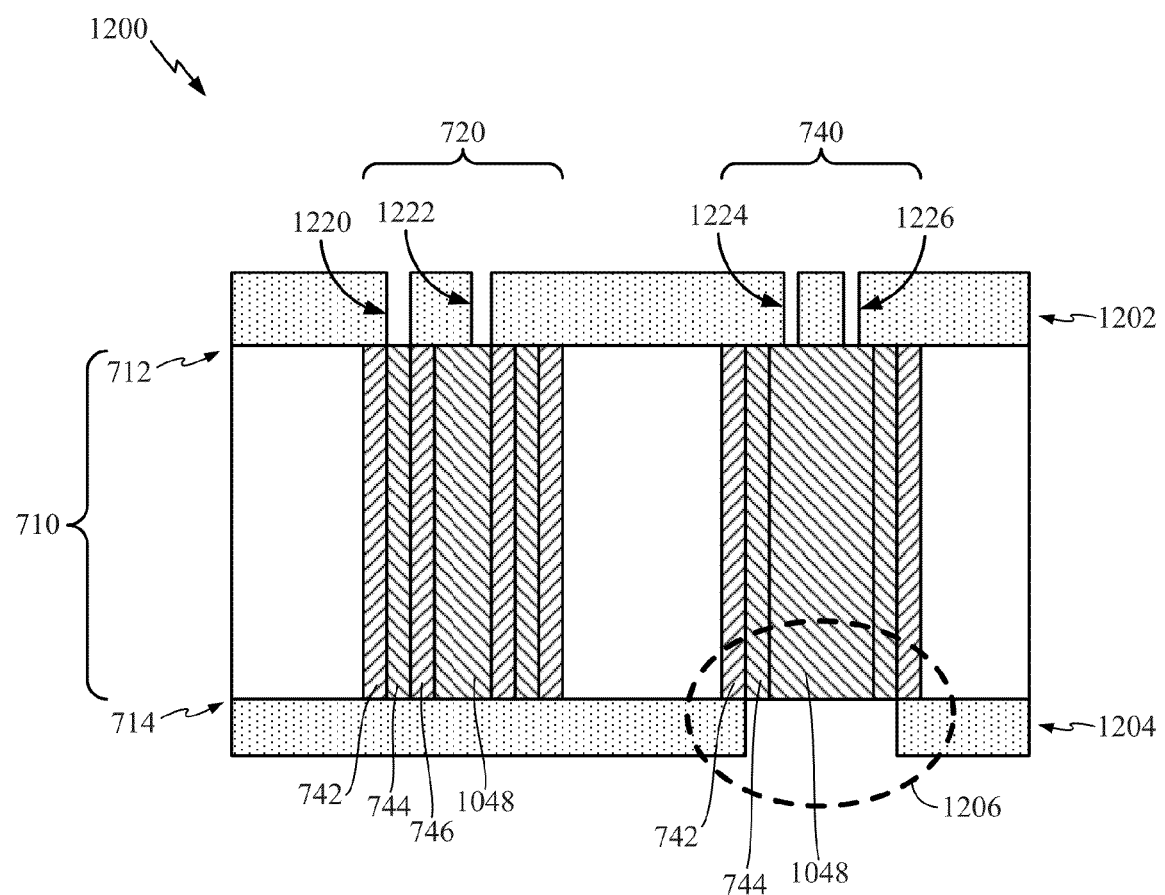
FIG. 12 is a cross section showing an exemplary die configuration after a sixth manufacturing process in a via first processing technique according to one aspect.

Turning now to FIG. 12, additional processes are performed in the fabrication of the through substrate vias. FIG. 12 is a cross section showing an exemplary die configuration after a sixth manufacturing process in a via first processing technique according to one aspect. A die 1200 includes an insulator 1202 deposited on the front side 712 and an insulator 1204 deposited on the back side 714. An opening 1220 is made in the insulator 1202 to expose the first conductor 744 and an opening 1222 is made to expose the second conductor 1048. Additionally, an opening 1224 and an opening 1226 are made in the insulator 1202. The insulator 1204 is removed in a region 1206 to expose the through substrate via 740.

Figure 13:
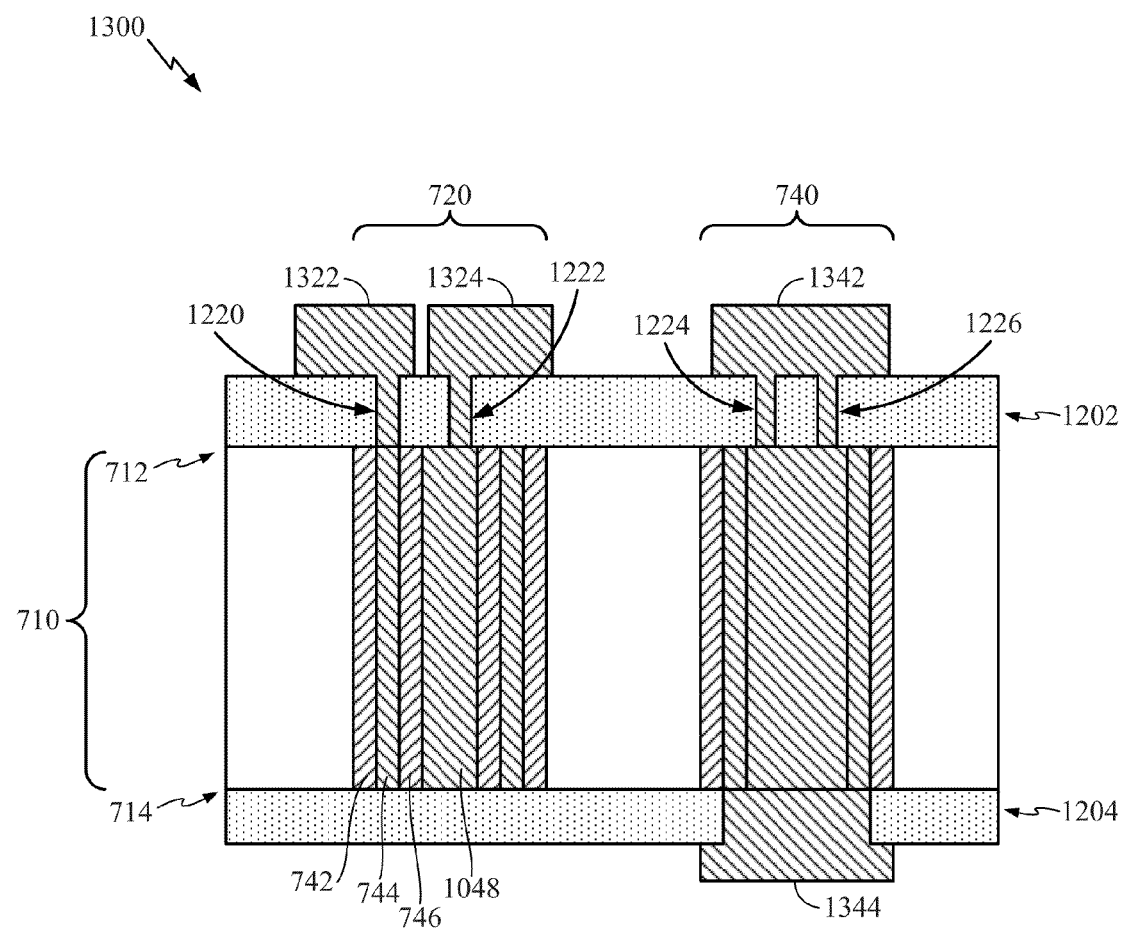
FIG. 13 is a cross section showing an exemplary die configuration after a seventh manufacturing process in a via first processing technique according to one aspect.

Turning now to FIG. 13, additional processes are performed in the fabrication of the through substrate vias. FIG. 13 is a cross section showing an exemplary die configuration after a seventh manufacturing process in a via first processing technique according to one aspect. A die 1300 includes a contact pad 1322 and a contact pad 1324 deposited to contact the first conductor 744 through the opening 1220 and the second conductor 1048 through the opening 1222, respectively. A capacitor is formed between the first conductor 744 and the second conductor 1048. The contact pad 1322 and the contact pad 1324 act as connections to two terminals of a capacitor. Additionally, a contact pad 1342 and a contact pad 1344 are deposited to contact the through substrate via 740. The through substrate via 740 may be used, for example, to convey signals between the front side 712 and the back side 714.

One aspect of the disclosure in which through substrate vias are fabricated using a via first process has been described. In via first processing, the through substrate vias are fabricated before or after front end of line device fabrication. Alternatively, in via last processing the through substrate vias are fabricated after other circuitry on the substrate. In another aspect of the disclosure, the through substrate vias with embedded decoupling capacitors are fabricated using a via last process. Through substrate vias manufactured using the via first process can be packed much more densely than through substrate vias manufactured using the via last process. Therefore, the via first process commonly has a larger number of through substrate vias with embedded decoupling capacitors creating better decoupling of the circuitry on the substrate.

Figure 14:
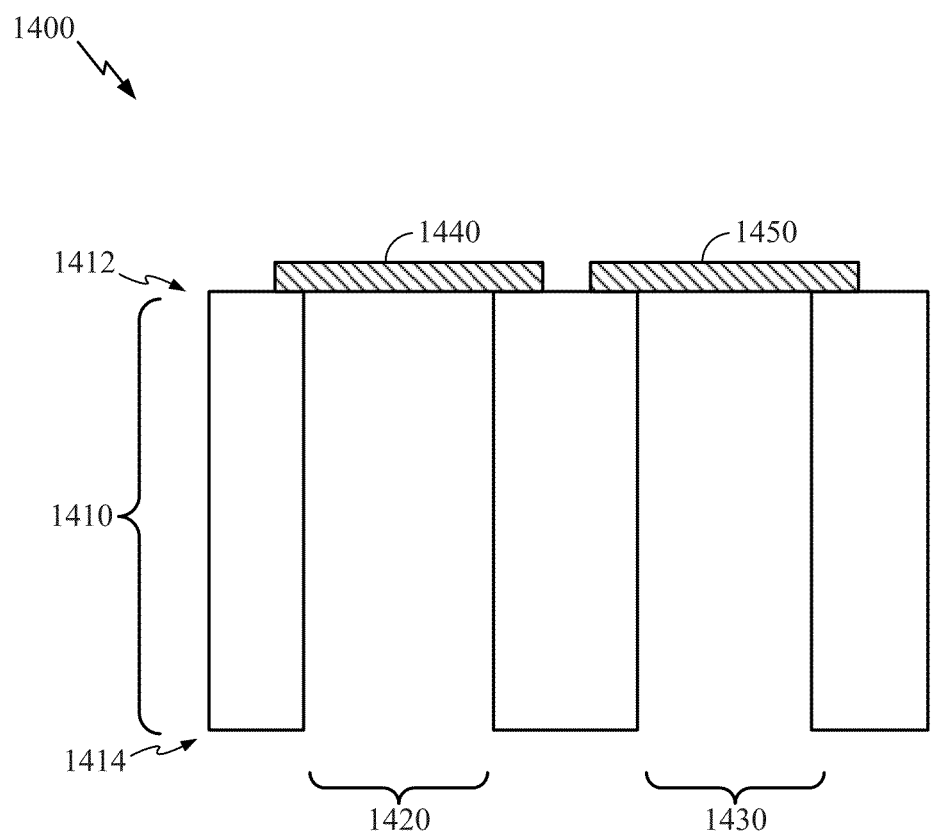
FIG. 14 is a cross section showing an exemplary die configuration after a first manufacturing process in a via last processing technique according to one aspect.

FIG. 14 is a cross section showing an exemplary die configuration after a first manufacturing process in a via last processing technique according to one aspect. A die 1400 includes a substrate 1410 with a front side 1412 and a back side 1414. The front side 1412 includes a contact pad 1440 and a contact pad 1450. Although only the contact pad 1440 and the contact pad 1450 are shown, the front side 1412 may contain other circuitry. The back side 1414 includes a through substrate via 1420 and a through substrate via 1430. The through substrate via 1420 and the through substrate via 1430 are etched after fabrication of circuitry (not shown) on the front side 1412 has completed.

Figure 15:
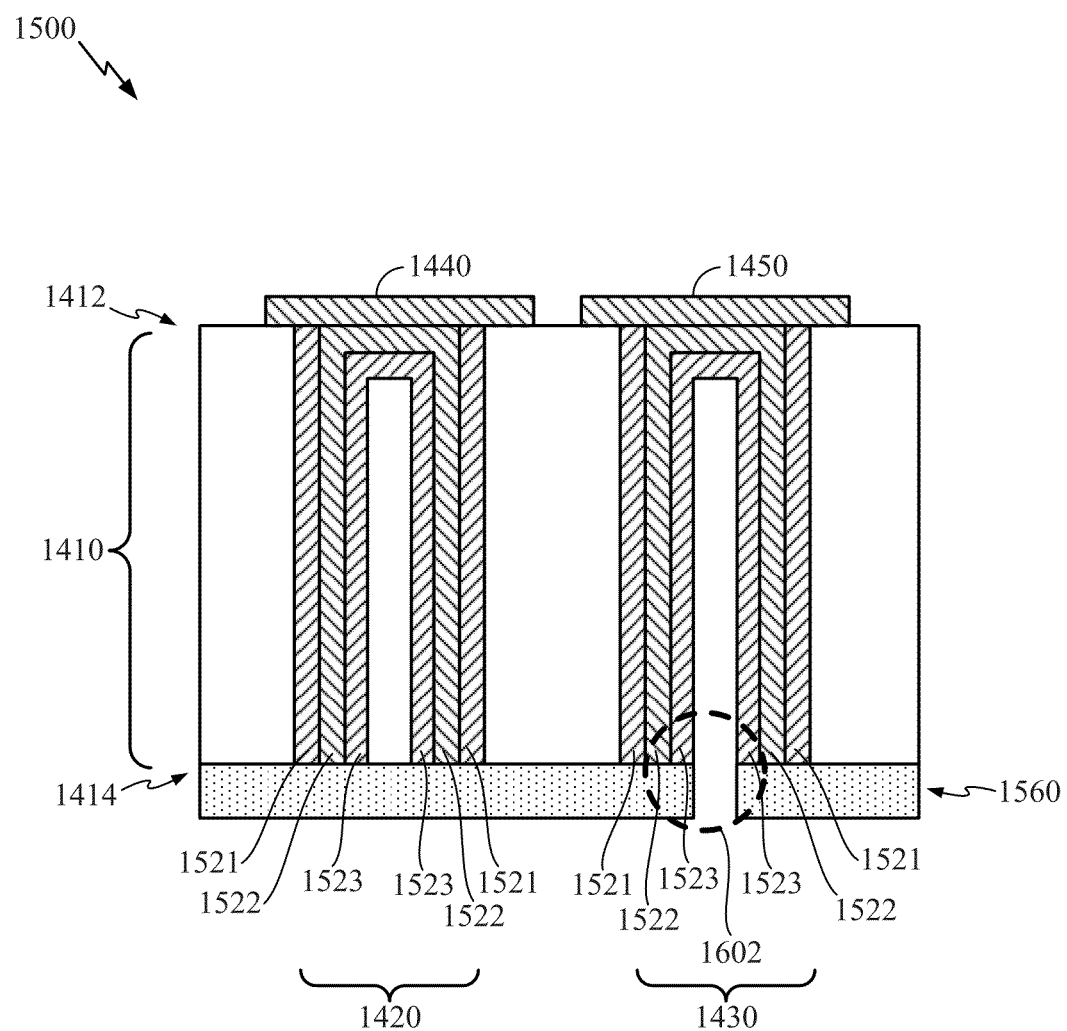
FIG. 15 is a cross section showing an exemplary die configuration after a second manufacturing process in a via last processing technique according to one aspect.

Turning now to FIG. 15, fabrication of the through substrate vias with embedded decoupling capacitors continues. FIG. 15 is a cross section showing an exemplary die configuration after a second manufacturing process in a via last processing technique according to one aspect. Deposited on the back side 1414 is a first insulator layer 1521. The first insulator layer 1521 is useful to prevent short circuiting of the through substrate via 1420 and the through substrate via 1430 with the substrate 1410. The first insulator layer 1521 coats sidewalls of the through substrate via 1420 and the through substrate via 1430. Additionally a conformal coating of a first conducting layer 1522 and a second insulating layer 1523 are deposited in the through substrate via 1420 and the through substrate via 1430. Next, a sacrificial layer 1560 is deposited on the back side 1414 and an opening above the through substrate via 1430 is etched at a region 1602. The sacrificial layer 1560 is used to mask the back side 1414 so that etching of the second insulator layer 1523 only affects certain through substrate vias. After etching of the second insulator layer 1523 occurs, the sacrificial layer 1560 may be removed.

Figure 16:
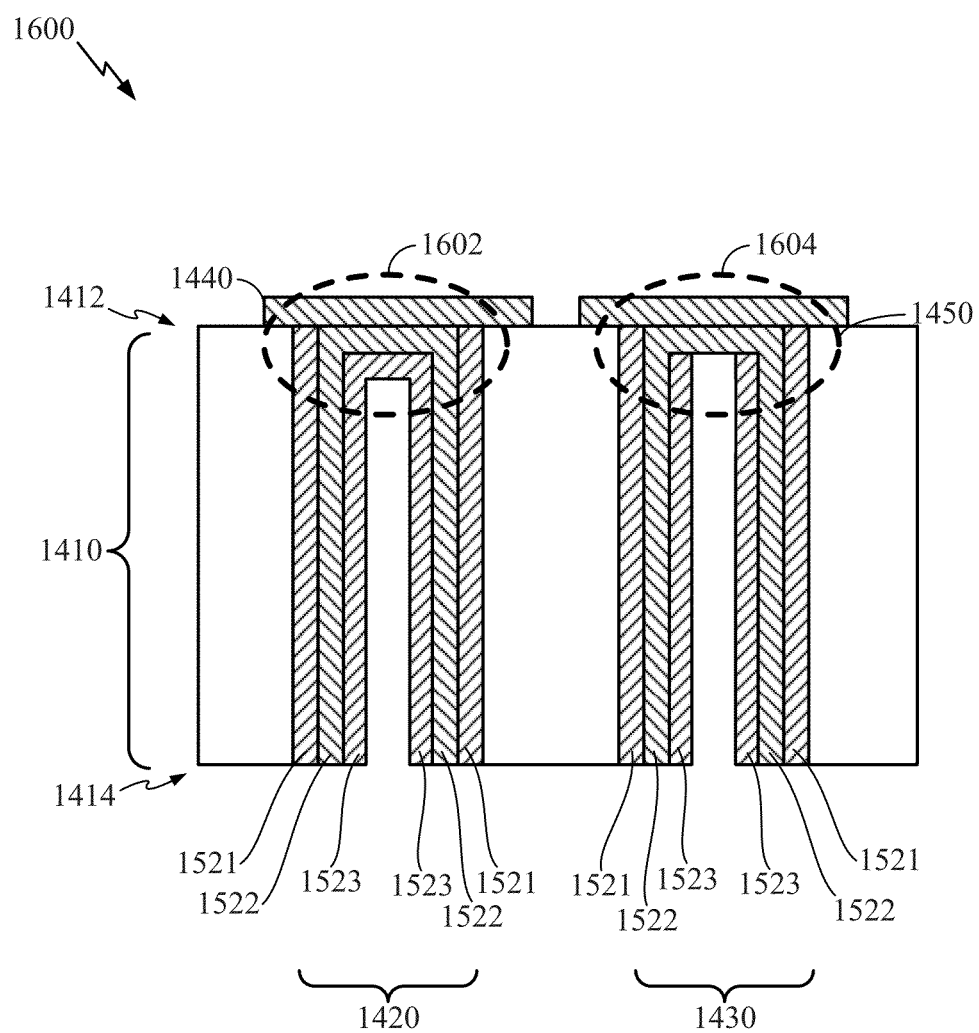
FIG. 16 is a cross section showing an exemplary die configuration after a third manufacturing process in a via last processing technique according to one aspect.

Turning now to FIG. 16, the results of the etch are shown. FIG. 16 is a cross section showing an exemplary die configuration after a third manufacturing process in a via last processing technique according to one aspect. After etching of the second insulator layer 1523 is carried out, the section of the second insulator layer 1523 at the bottom of any through substrate vias that are not masked by the sacrificial layer 1560 are removed. At a region 1604 the second insulator layer 1523 at the bottom of the through substrate via 1430 has been removed. In contrast, at a region 1602 the second insulator layer 1523 remains intact at the bottom of the through substrate via 1420.

Figure 17:
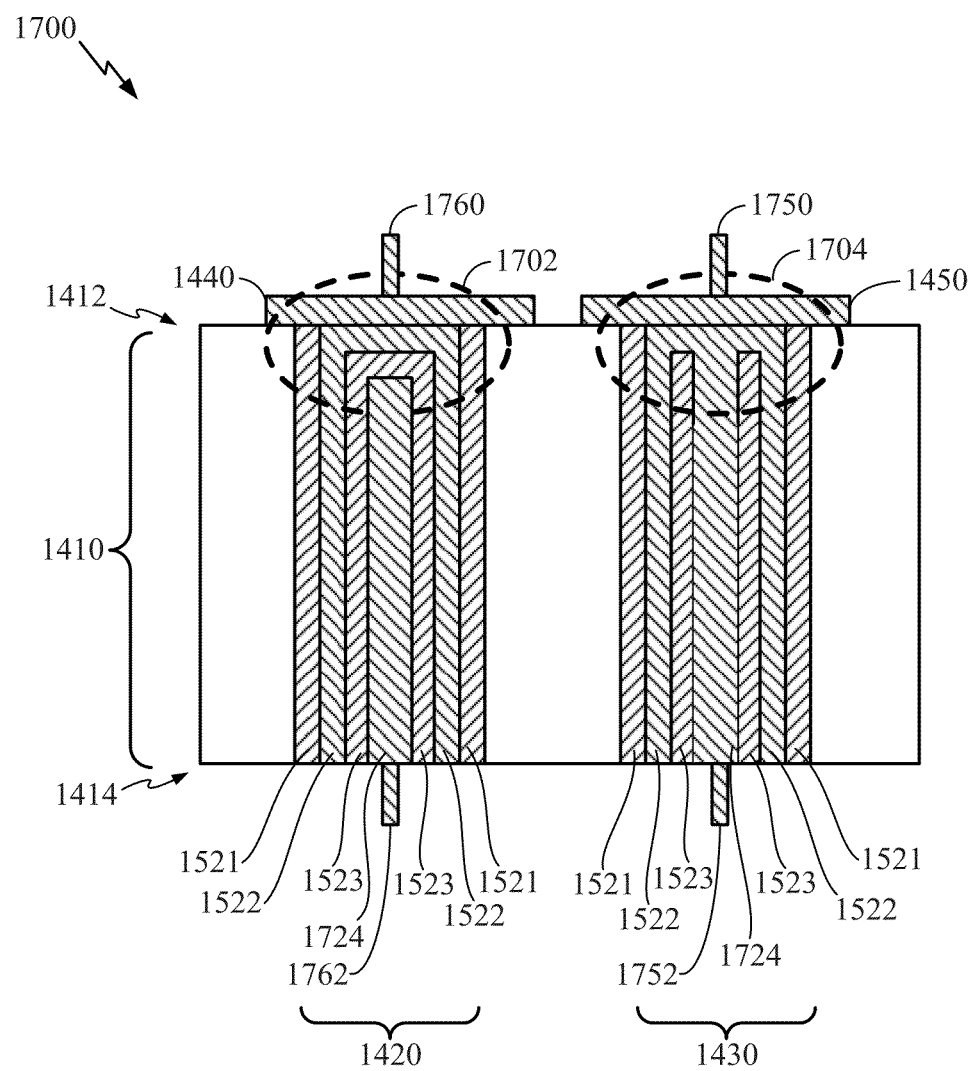
FIG. 17 is a cross section showing an exemplary die configuration after a fourth manufacturing process in a via last processing technique according to one aspect.

Turning now to FIG. 17, an additional conductor layer is deposited. FIG. 17 is a cross section showing an exemplary die configuration after a fourth manufacturing process in a via last processing technique according to one aspect. A second conductor layer 1724 is deposited to fill the through substrate via 1420 and the through substrate via 1430. At a region 1704, the second conductor layer 1724 couples to the contact pad 1450. A contact 1750 is coupled to the contact pad 1450, and a contact 1752 is coupled to the second conductor layer 1724. As a result, the through substrate via 1430 may be used to convey signals from the front side 1412 to the back side 1414. In contrast, at a region 1702 the second conductor layer 1724 is separated from the contact pad 1440 by the second insulator layer 1523. A contact 1760 is coupled to the contact pad 1440, and a contact 1762 is coupled to the second conductor layer 1724. As a result, the through substrate via 1420 functions as a decoupling capacitor when contact is made to the second conductor layer 1724 on the back side 1414 and to the contact pad 1440 on the front side 1412.

Figure 18:
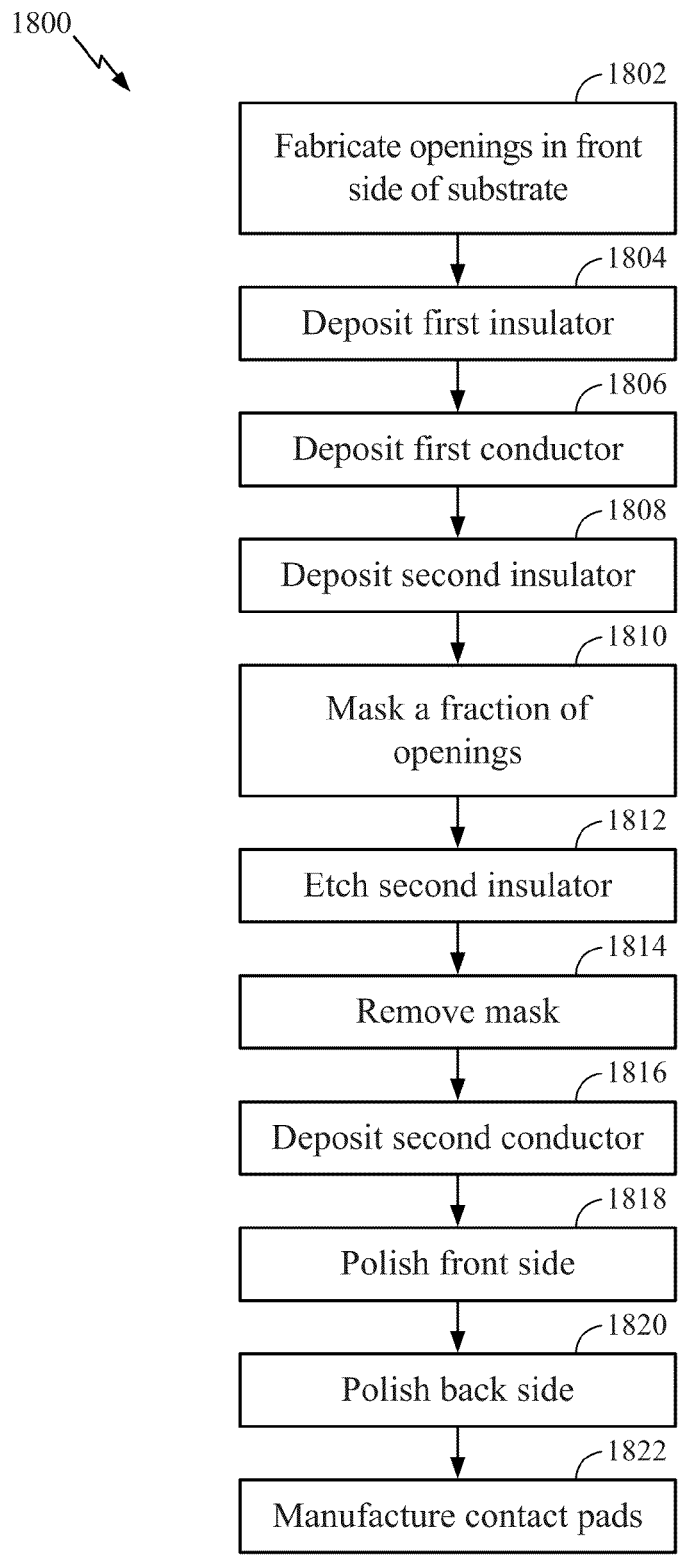
FIG. 18 is a flow diagram describing an exemplary process for manufacturing through substrate vias with embedded decoupling capacitors according to one aspect.

Turning now to FIG. 18, an exemplary process for manufacturing openings with embedded decoupling capacitors according to one aspect will be summarized. A routine 1800 starts at block 1802. At block 1802, openings are fabricated in the front side of the substrate. The openings may be, for example, through substrate vias. Continuing to block 1804, a first insulator is deposited, followed by, at block 1806, a first conductor, and, at block 1808, a second insulator. Following deposition, at block 1810, a fraction of the openings are masked. The openings which are masked will have embedded decoupling capacitors whereas the remaining fraction of through substrate vias will not. Continuing to block 1812, the second insulator is etched (only from those openings not masked), and then, at block 1814, the mask is removed. Next, at block 1816, a second conductor is deposited to serve as the center of the openings. At block 1818, the front side of the substrate is polished to remove sections of the deposited layers that are not contained inside the openings. At block 1820, the back side of the substrate is polished to expose the openings. Continuing to block 1822, contact pads are manufactured on the front side and the back side to contact the conducting layers deposited earlier.

Figure 19:
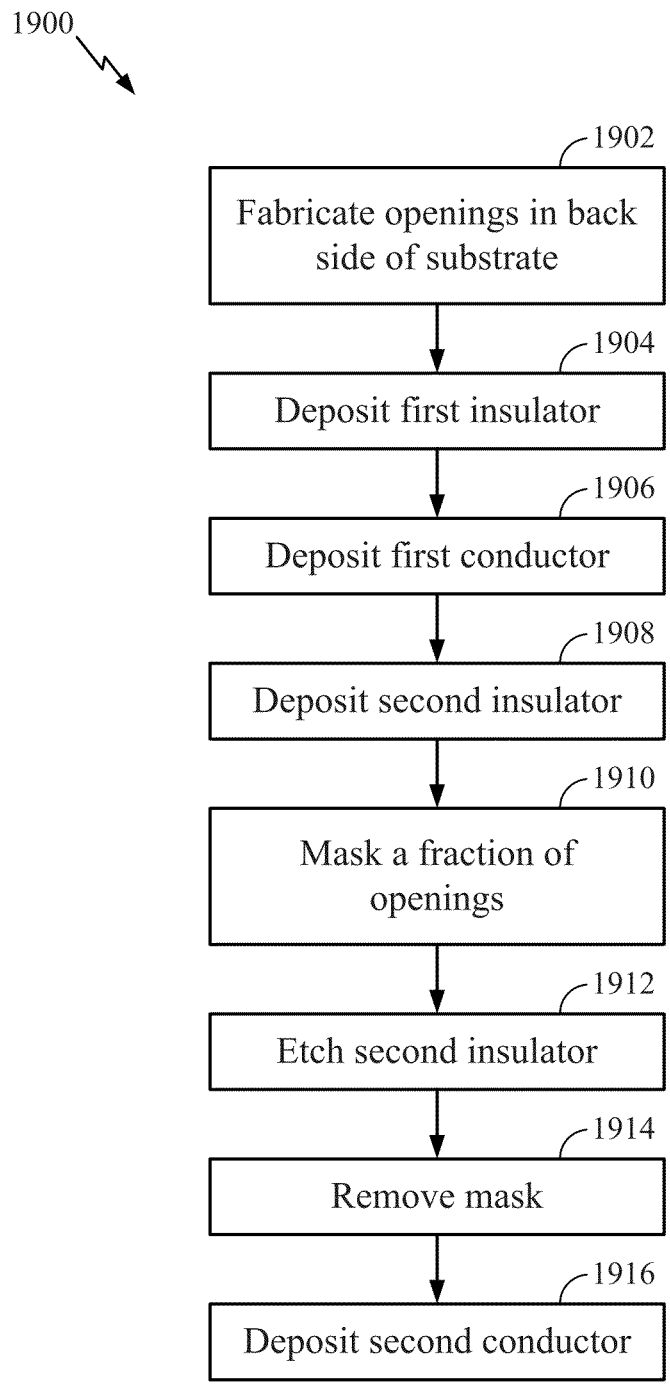
FIG. 19 is a flow diagram describing an alternative exemplary process for manufacturing through substrate vias with embedded decoupling capacitors according to one aspect.

Turning now to FIG. 19, an alternative exemplary process for manufacturing openings with embedded decoupling capacitors according to one aspect will be summarized. A routine 1900 starts at block 1902. At block 1902, after the substrate is thinned openings are fabricated on the back side of the substrate. Continuing to block 1904, a first insulator is deposited followed by block 1906, when a first conductor is deposited. A second insulator is deposited at block 1908. At block 1910, a fraction of the openings are masked. The fraction of openings which are masked will have embedded decoupling capacitors. Continuing to block 1912, the second insulator is etched from the openings that are not masked. A directional etch can etch the insulator from the bottom while leaving the insulator on the sidewalls to enable connectivity between the contacts and the conductor to be deposited. At block 1914, the mask is removed, and the routine 1900 proceeds to block 1916 where the second conductor is deposited.

Figure 20:
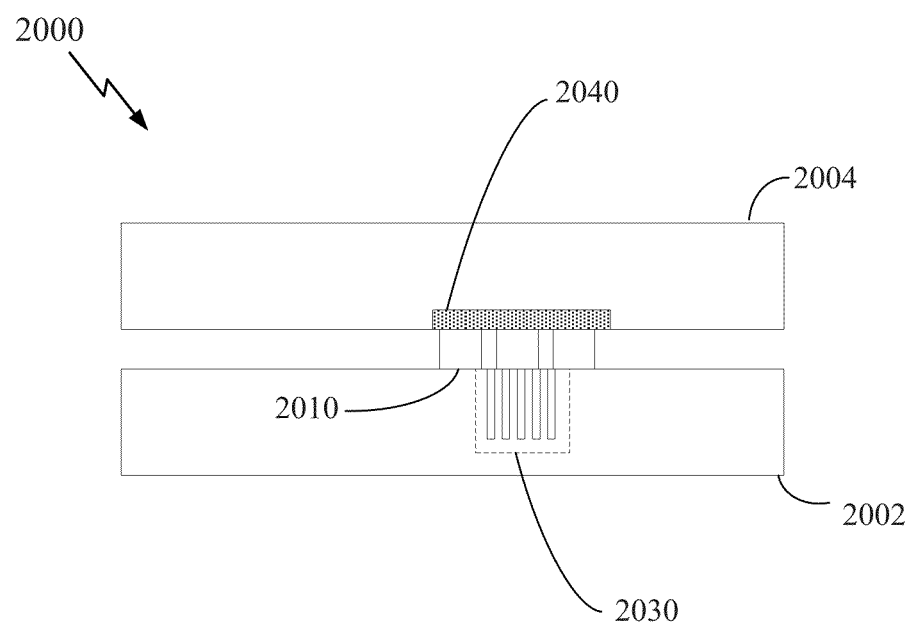
FIG. 20 is a block diagram illustrating an exemplary array of through substrate vias with embedded capacitors according to one aspect.

FIG. 20 is a block diagram illustrating an exemplary array of through substrate vias with embedded capacitors according to one aspect. A stacked IC device 2000 includes a first die 2002 and a second die 2004. The second die 2004 may contain a circuit 2040 such as a microprocessor for processing information. The second die 2004 is coupled to the first die 2002 through interconnects 2010. The first die 2002 may contain an array 2030 of through substrate vias with decoupling capacitors. The array 2030 may be configured to be very close to (for example, directly underneath) the microprocessor 2040 to improve the effect of the decoupling capacitors on the microprocessor 2040. Accordingly, a local supply of charge for switching activity is available to the microprocessor 2040 nearly instantaneously on demand.

Figure 21:
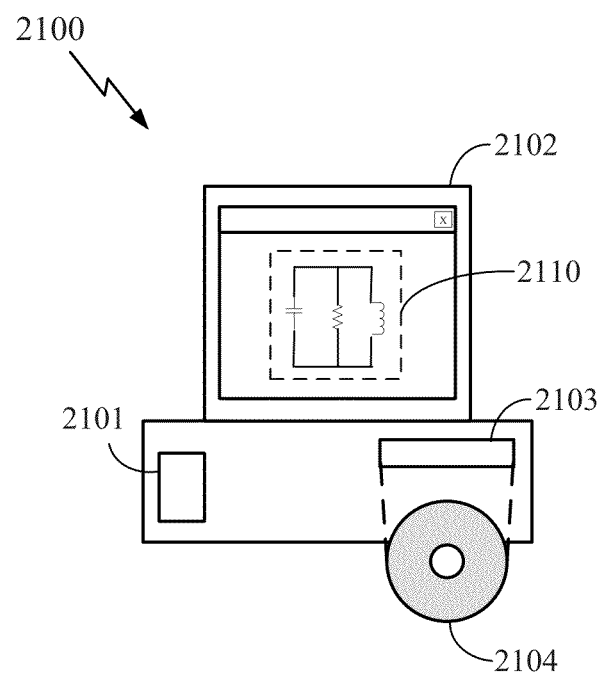
FIG. 21 is a block diagram illustrating a design workstation used for circuit, layout, and logic design of the disclosed semiconductor integrated circuit.

FIG. 21 is a block diagram illustrating a design workstation used for circuit, layout, and logic design of the disclosed semiconductor integrated circuit. A design workstation 2100 includes a hard disk 2101 containing operating system software, support files, and design software such as Cadence or OrCAD. The design workstation 2100 also includes a display to facilitate design of a circuit design 2110. The circuit design 2110 may include the circuitry as disclosed above. A storage medium 2104 is provided for tangibly storing the circuit design 2110. The circuit design 2110 may be stored on the storage medium 2104 in a file format such as GDSII or GERBER. The storage medium 2104 may be a CD-ROM, MID, hard disk, flash memory, or other appropriate device. Furthermore, the design workstation 2100 includes a drive apparatus 2103 for accepting input from or writing output to the storage medium 2104.

Data recorded on the storage medium 2104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 2104 facilitates the design of the circuit design 2110 by decreasing the number of processes for designing semiconductor ICs.

Although only two through substrate vias have been illustrated, a stacked IC may contain many more through substrate vias. A stacked IC may contain any number of either of the two configurations of through substrate vias including exclusively using one configuration or the other.

Although only two coaxial conductors are described in the through substrate vias of the disclosure, minor modifications may allow additional coaxial conductors inside the through substrate vias. Multiple coaxial conductors may be used, for example, to pass multiple signals through le through substrate via or to build multiple capacitors.

Although specific processes have been conveyed through the use of the drawings and descriptions thereof, it should be understood that the through substrate via with embedded decoupling capacitor may be manufactured through alternate processes not described in this disclosure.

Although specific circuitry has been set forth, it will be appreciated by those skilled in the art that not all of the disclosed circuitry is required to practice the disclosure. Moreover, certain well known circuits have not been described so as to maintain focus on the disclosure.

Although the present disclosure and its advantages have been described in detail, it should be understood that various changes, substitutions, and alterations can be made herein without departing from the technology of the disclosure as defined by the appended claims. Moreover, the scope of the present application is not intended to be limited to the particular aspects of the process, machine, manufacture, composition of matter, means, methods, and steps described in the specification. As one of ordinary skill in the an will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor die having a substrate with a first side and a second side, the method comprising:
   fabricating a plurality of openings for a plurality of through substrate vias and a through substrate via without a capacitor on the first side of the semiconductor die, the through substrate via without the capacitor having a center offset with respect to each of the plurality of through substrate vias;
   depositing a first conductor in the plurality of through substrate vias;
   depositing a first dielectric on the first conductor;
   depositing a second conductor on the first dielectric; and
   depositing a protective insulator layer on the second side of the substrate covering the plurality of through substrate vias.

2. The method of claim 1, further comprising:
   polishing the first side of the semiconductor die to expose the first conductor and the second conductor, the first conductor and the second conductor being configured as terminals of a decoupling capacitor.

3. The method of claim 1, further comprising depositing a second dielectric in the plurality of through substrate vias before depositing the first conductor.

4. The method of claim 1, further comprising:
   removing the first dielectric from a fraction of the plurality of through substrate vias before depositing the second conductor; and
   polishing the second side of the substrate to expose the first conductor of the fraction of the plurality of through substrate vias,
   wherein the fraction of the plurality of through substrate vias are configured to convey signals from the first side to the second side of the substrate.

5. The method of claim 1, further comprising depositing a third conductor outside of the second conductor.

6. The method of claim 5, further comprising depositing a third dielectric separating the second conductor from the third conductor.

7. The method of claim 1, further comprising integrating logic circuitry for a microprocessor within the semiconductor die to receive charge from the plurality of through substrate vias.

8. The method of claim 1, further comprising integrating the semiconductor die into a set top box, music player, video player, entertainment unit, navigation device, communications device, personal digital assistant (PDA), fixed location data unit, microprocessor and/or a computer.

9. A method of manufacturing a stacked integrated circuit (IC) having a substrate with a first side and a second side, the method comprising:

fabricating a first opening for a first through substrate via and an adjacent opening for a through substrate via without a capacitor on the second side of the substrate of a semiconductor die, the through substrate via without the capacitor having a center offset with respect to the first through substrate via;

depositing a first conductor in the first through substrate via;

depositing a first dielectric on the first conductor;

depositing a second conductor on the first dielectric, the first conductor and the second conductor configured as terminals of a decoupling capacitor; and depositing a protective insulator layer on the second side of the substrate covering the first through substrate via.

10. The method of claim 9, further comprising depositing a second dielectric in the first through substrate via before depositing the first conductor.

11. The method of claim 9, further comprising:

fabricating a second opening for a second through substrate via on the second side of the substrate of the semiconductor die.

12. The method of claim 11, further comprising:

depositing a third conductor in the second through substrate via;

depositing a third dielectric on the third conductor; and depositing a fourth conductor on the third dielectric.

13. The method of claim 12, further comprising:

polishing a first side of the semiconductor die to expose the first conductor, the second conductor, the third conductor, and the fourth conductor.

14. The method of claim 13, further comprising:

removing the third dielectric from the second through substrate via before depositing the fourth conductor; and polishing the second side of the substrate to expose the third conductor of the second through substrate via, wherein the second through substrate via is configured to convey signals from the first side to the second side of the substrate.

15. The method of claim 9, further comprising depositing a fifth conductor outside of the second conductor.

16. The method of claim 15, further comprising depositing a fourth dielectric separating the second conductor from the fifth conductor.

17. The method of claim 9, further comprising integrating logic circuitry for a microprocessor within the semiconductor die to receive charge from the first through substrate via.

18. The method of claim 9, further comprising integrating the stacked IC into a set top box, music player, video player, entertainment unit, navigation device, communications device, personal digital assistant (PDA), fixed location data unit, microprocessor and/or a computer.

* * * * *